United States Patent [19]

Moon et al.

[11] Patent Number: 5,136,593
[45] Date of Patent: Aug. 4, 1992

[54] APPARATUS AND METHOD FOR FIXED DELAY TREE SEARCH

[75] Inventors: Jaekyun J. Moon, Pittsburgh; L. Richard Carley, Murraysville, both of Pa.

[73] Assignee: Carnegie-Mellon University, Pittsburgh, Pa.

[21] Appl. No.: 428,556

[22] Filed: Oct. 30, 1989

[51] Int. Cl.$^5$ .................... G06F 11/10; H03M 13/12
[52] U.S. Cl. ......................................... 371/43; 371/72
[58] Field of Search ............... 371/43, 72, 68.2, 67.1; 375/13, 15

[56] References Cited

U.S. PATENT DOCUMENTS

| | | | |
|---|---|---|---|
| 4,015,238 | 3/1977 | Davis | 371/43 |
| 4,536,878 | 8/1985 | Rattlingourd et al. | 371/43 |
| 4,606,027 | 8/1986 | Otani | 371/43 |
| 4,614,933 | 9/1986 | Yamashita et al. | 341/107 |
| 4,669,084 | 5/1987 | Hartman et al. | 371/43 |
| 4,706,211 | 11/1987 | Yamazaki et al. | 364/757 |
| 4,748,626 | 5/1988 | Wong | 371/43 |
| 4,797,887 | 1/1989 | Yamasaki et al. | 371/43 |
| 4,805,174 | 2/1989 | Kubota et al. | 371/43 |
| 4,847,871 | 7/1989 | Matsushita et al. | 371/43 |
| 4,910,669 | 3/1990 | Gorin et al. | 364/200 |

Primary Examiner—Jerry Smith
Assistant Examiner—Phung Chung
Attorney, Agent, or Firm—Ansel M. Schwartz

[57] ABSTRACT

A method for identifying a signal subject to intersymbol interference comprising the steps of receiving $\tau+1$ samples of the signal where $\tau$ is greater than or equal to one; searching a tree representation of known values to determine the path of the branch of the tree which most closely corresponds to the $\tau+1$ samples of the signal; and releasing the symbol of the first metric of the determined branch. The released symbol is the identity of the sample. Preferably, the receiving step includes the step of receiving $\tau+1$ sequential samples, with each sample corresponding to a unique portion of the signal, and the searching step includes the step of comparing each symbol of each metric of each path of each branch with the symbol's corresponding sample in regard to time. An apparatus for identifying a signal subject to intersymbol interference comprising a device for implementing a fixed delay tree search on samples of the signal to determine a symbol associated with a given sample and then releasing that sample. The apparatus also is comprised of a device for inputting samples to the implementing a device.

15 Claims, 5 Drawing Sheets

APPARATUS AND METHOD FOR FIXED DELAY TREE SEARCH

FIELD OF THE INVENTION

The present invention is related to the detection of digital information transmitted over channels with intersymbol interference as well as random noise. More specifically, the present invention is related to the use of a tree search to identify the digital information transmitted over channels.

BACKGROUND OF THE INVENTION

Intersymbol interference (ISI) presents the primary impediment to the reliable transmission of digital information over highly band-limited channels. High-speed digital data transmission over telephone lines and high-density digital recording on magnetic medium are good examples of the digital transmission in the presence of ISI. ISI also arises in a certain modulation scheme called partial response signaling wherein some portions of ISI are allowed or even enhanced for the purpose of spectral shaping.

When ISI is present, the signal energy available for detection spreads out into many symbol intervals. This motivates the use of detection schemes which make decisions based on a series of observation samples. In the presence of large ISI, the performance of any detector making decisions on a symbol-by-symbol basis is expected to fall well below the optimum performance.

One of the most prominent detection schemes that make decisions based on observations through many symbol intervals is the Viterbi detector (VA), which finds the input sequence that "best matches" the observation sequence in a recursive fashion. It is well known that the VA is effectively the optimum detector for the channels with ISI for any reasonable criterion. A drawback of the VA is its complexity, which grows exponentially with the extent of ISI. For many real channels the requirement on the data rate or linear storage density inevitably introduces significant ISI. The processing limitation and/or implementation cost prohibit the use of the VA for these channels. Another disadvantage associated with this scheme is the inherent variable delay between the time that the observed signal is fed into the detector and the time that the detected bits become available. This can hamper the timing recovery.

The present invention involves a sequence detection algorithm, with substantially reduced cost and decision delay but without a significant performance loss compared to the optimum detector. It is accomplished without violating the speed requirement imposed by data rates of modern digital transmission or storage systems. Therefore, the fast processing capability is another essential factor to be considered in developing practical sequence detectors.

SUMMARY OF THE INVENTION

The present invention pertains to a method for identifying a signal subject to ISI comprising the steps of: receiving $\tau + 1$ samples of the signal where $\tau$ is greater than or equal to one; searching a tree representation of known values to determine the path of the branch of the tree which most closely corresponds to the $\tau$ samples of the signal; and releasing the symbol of the first metric of the determined branch. The released symbol is the identity of the sample. Preferably, the receiving step includes the step of receiving $\tau + 1$ sequential samples, with each sample corresponding to a unique portion of the signal, and the searching step includes the step of comparing each symbol of each metric of each path of each branch with its corresponding sample in regard to time.

The present invention pertains to an apparatus for identifying a signal subject to ISI. The apparatus comprises means for implementing a fixed delay tree search on samples of the signal to determine a symbol associated with a given sample and then releasing that symbol. The apparatus also is comprised of means for inputting samples to the implementing means.

BRIEF DESCRIPTION OF THE DRAWINGS

In the accompanying drawings, the preferred embodiments of the invention and preferred methods of practicing the invention are illustrated in which.

DESCRIPTION OF THE PREFERRED EMBODIMENT

Figure 7:
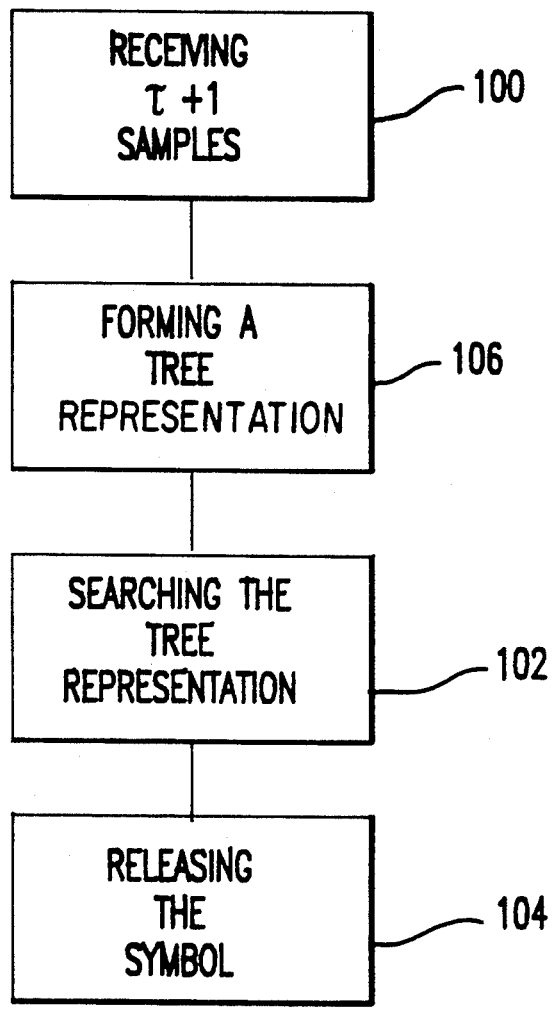
FIG. 7 is a flow chart of a method for identifying a signal subject to ISI.

The present invention pertains to a method for identifying a signal subject to ISI and preferably minimum run-length limited coding. Referring to FIG. 7, the method comprises the steps 100, 102, 104 of receiving $\tau + 1$ samples of the signal where is greater than or equal to one; searching a tree representation 10, shown in FIG. 1, of known responses to determine the path 12 of the branch 14 of the tree 10 which most closely corresponds to the $\tau + 1$ samples of the signal; and releasing the symbol 16 of the first metric 18 of the determined branch 14, respectively. The released symbol 16 is the identity of the sample. Preferably, the receiving step includes the step of receiving $\tau + 1$ sequential samples, with each sample corresponding to a unique portion of the signal; and the searching step includes the step of comparing each symbol 16 of each metric 18 of each path 12 of each branch 14 with its corresponding sample in regard to time. Preferably, the metric is the difference between the expected value for a given sample and the actual received value, squared, although it can be defined differently.

Before the searching step 102, there is preferably the step 106 of forming the tree representation 10 without paths 12 that violate any run-length limited constraints. After the releasing step, there can be the step of repeating with a next in time sample the receiving, searching and releasing steps until there is no sample left to release. Additionally, after the releasing step, there can be included the steps of discarding the unused branch 14; and extending each path 12 of the surviving branch 14 by one metric 18.

Before, the repeating step, there can be the step of adjusting the signal by an amount corresponding to the difference between the value of the symbol 16 of the released metric 18 and the actual value of the sample associated with the released metric 18 such that the value of the next in time sample more closely approximates the value of the symbol 16 which identifies it.

Figure 2:
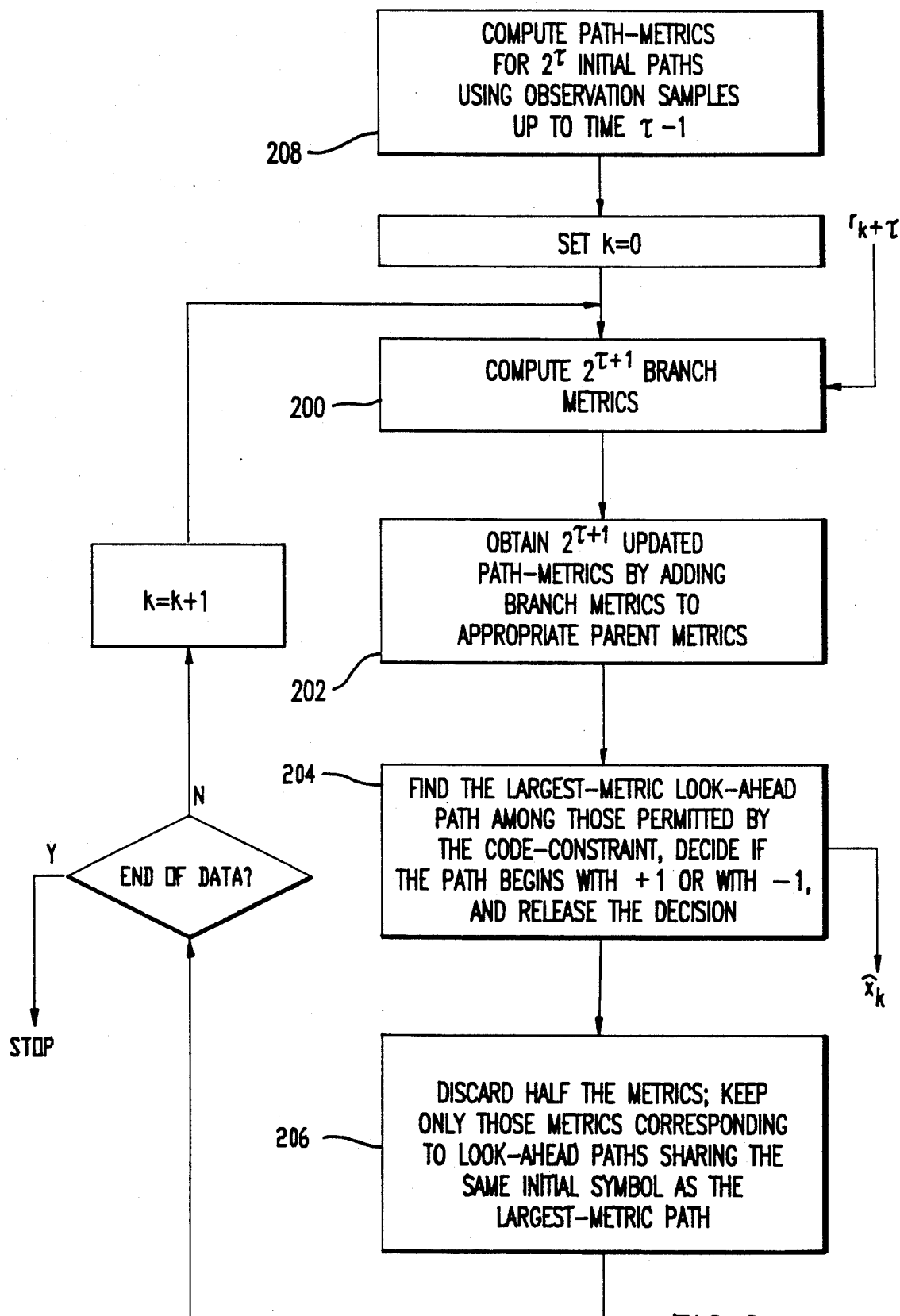
FIG. 2 is a flow chart diagram of the fixed delay tree search algorithm.

The forming step can include the step of forming the tree representation 10 such that the symbol 16 of each metric 18 is predetermined by its position in the tree representation 10 and the symbol 16 associated with each metric 18 can be obtained from its position without its symbol 16 having to be stored in memory. The above is shown in FIG. 2, which is a flow chart of the FDTS algorithm.

For instance, the symbol 16 can be a digital (binary) signal which can have a 1 or a −1 that is representative of a value of approximately 5 volts or approximately 0 volts, respectively. Each branch 18 is comprised of paths 12 made up of metrics 18. The first metric 18 is the metric 18 which is at the start of the branch 14. The tree representation 10 is of a design such that the symbol 16 of 1 is at the top of each metric 18 emminating from a node 20 and the symbol 16 of −1 is associated with each metric emminating downward from the node 20.

Figure 1:
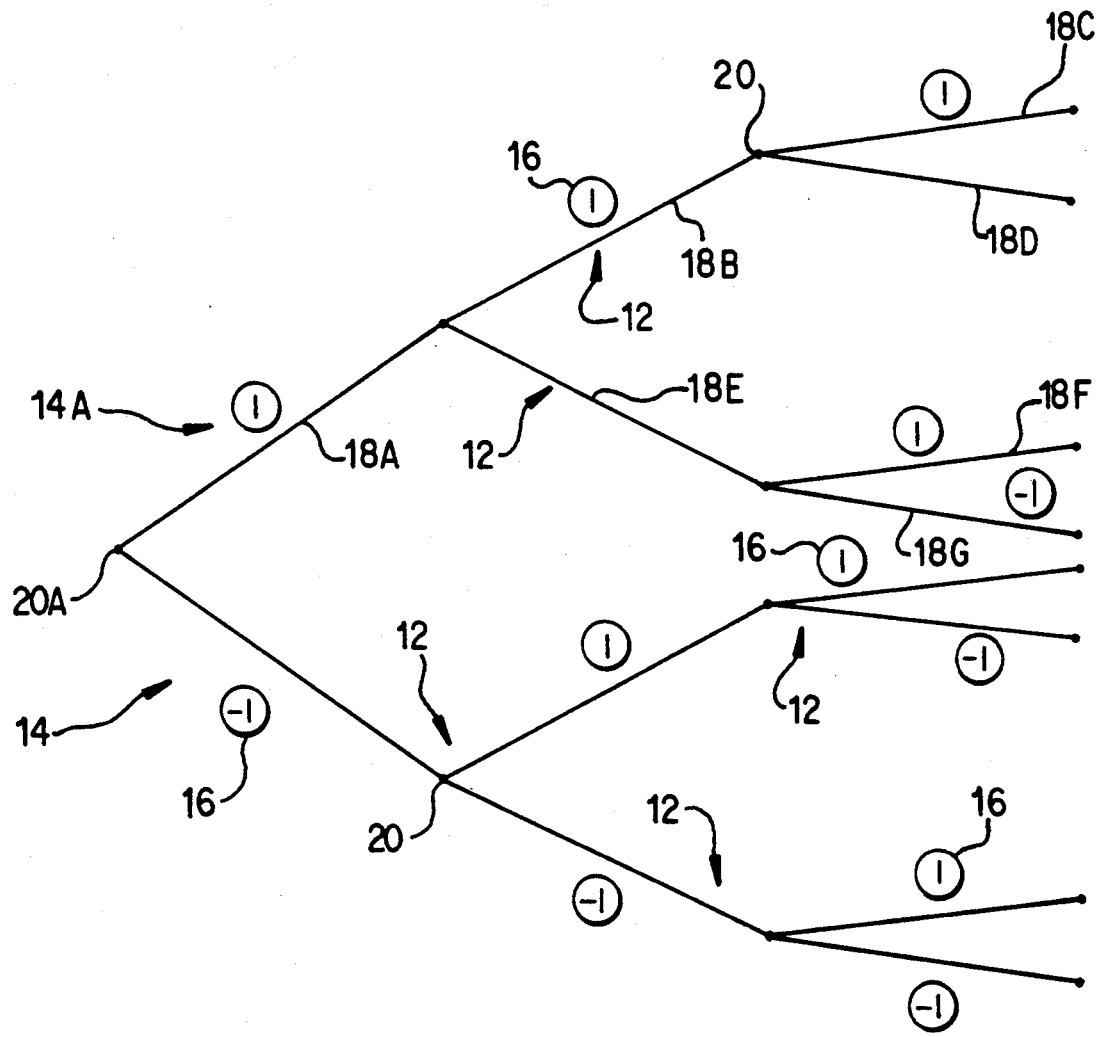
FIG. 1 is a tree representation of a binary sequence in accordance with the present invention.

The given branch 14 has several paths 12. For example, as shown in FIG. 1, the branch 14a emminating upwards from a node 20a is comprised of metrics 18a, 18b, and 18c. Another path 12 emminating from node 20a is comprised of 18a, 18b, and 18d. Still another path 12 emminating from node 20a is comprised of metric 18a, 18e, and 18f. Lastly, another path 12 emminating from node 20a is metric 18a, metric 18e, and metric 18g.

Figure 3:
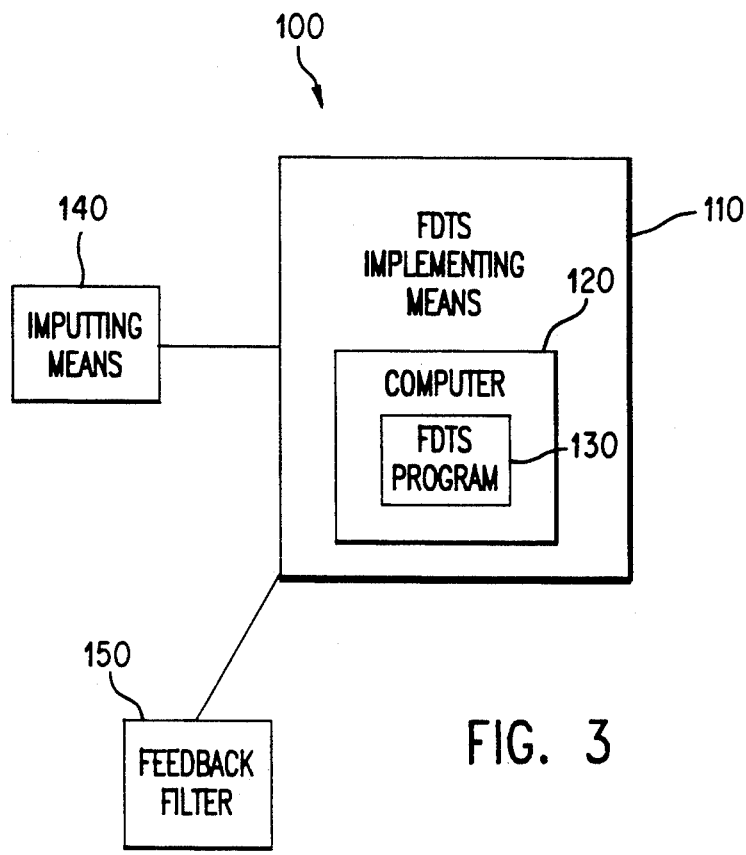
FIG. 3 is a schematic representation of an apparatus for identifying a signal subject to intersymbol interference.

The present invention pertains to an apparatus 100, as shown in FIG. 3, for identifying a signal subject to ISI and preferably run-length limited coding. The apparatus 100 comprises means for implementing a fixed delay tree search on samples of the signal to determine a symbol of a given sample and then releasing that symbol. The implementing means 110 preferably includes a computer 120, such as a computational engine, having a fixed delay tree search program 130.

The apparatus 100 additionally is comprised of means 140 for inputting samples to the implementing means 110. The apparatus 110 can also include a feedback filter 150 which receives a symbol released from the implementing means 110 and produces a correction factor corresponding to the difference between the value of the release symbol and the actual value of the sample associated with the release symbol such that the value of the next in time sample more closely approximates the value of the symbol which identifies it. See FIG. 4 which is a schematic representation of the structural relationship of the feedback filter 150 with the FDTS means 110.

Figure 5:
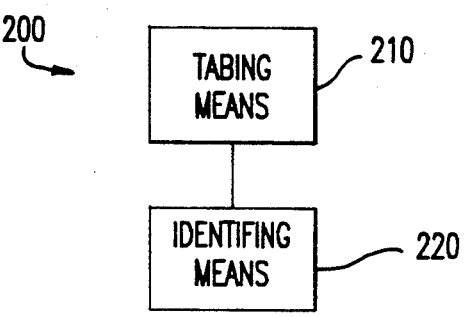
FIG. 5 is a schematic representation of an alternative embodiment of the apparatus for identifying a signal subject to intersymbol interference.

Preferably, the apparatus 100 has the computer 120 as an array of single processing units organized in the tree representation 10 to identify the symbol associated with a given sample. Alternatively, the apparatus 200, as shown in FIG. 5, is comprised of means 210 for taking samples of the signal. Additionally, the apparatus 200 is comprised of means 220 for identifying the symbol 16 associated with a given sample from a review of $\tau + 1$ samples, where is greater than or equal to one and a given sample is one of the $\tau + 1$ samples. The signal to noise ratio of a given sample is greater than 2 db.

More specifically, when the minimum run-length constraint is imposed, the minimum distance error event often consists of only a single-bit error. In this case, the fixed delay tree search (FDTS) attains the same effective minimum distance as the VA but with substantially reduced hardware complexity.

The FDTS is essentially based on a depth-limited search algorithm that can be in the form of a computer program 130. The algorithm is based on the tree-representation (as opposed to trellis representation) of digital sequences. A tree representation of binary sequences is shown in FIG. 1. There are two branches 14 comprised of two metrics 18 coming out of each node 20 and the number of metrics 18 to be expanded increases exponentially with the depth of the tree 10. Each input sequence corresponds to a path 12 made up of these metrics 18 for each branch 14. The label associated with each branch 14 is the input symbol 16 corresponding to that branch 14. Also associated with each branch 14 is the noiseless channel output y and the branch metric $-(c-y)^2$, where c is the observed data sample for that symbol interval. An impulse response of length l,y associated with a particular branch depends on the last l input symbols (including the present symbol) lying on the path leading to that branch.

The information in the tree is comprised of the next latest in time samples which are also held or delayed from release by a fixed predetermined period of time. The basic idea of the FDTS algorithm is to look ahead from a given node levels in the tree and find the path with the largest up-to-date accumulated metric (i.e., the path that is closest in the Euclidean sense to the observed noisy sequence). The first symbol 16 lying in that path is then decided and released as the transmitted symbol 16. FDTS then discards all paths not sharing the same initial symbol 16 as the released symbol 16. In the next time-interval, a new observation sample is received and the surviving paths are extended one-level further. The procedure is repeated. Notice that in the look-ahead tree, all paths ending at the top half of the nodes have the common initial input symbol 1 and the other half paths all begin with −1. For this reason, the detector does not have to store the path map explicitly. The path metrics are the only quantities to be stored.

The FDTS can be implemented recursively as follows: At the start of the detection process and referring to FIG. 2, the detector computes metrics for the $2^{\tau+1}$ initial paths by exhaustively walking through all the branches and using observation samples from time 0 up to time $\tau + 1$ as shown in work 200. The $2^{\tau+1}$ path metrics are then entered in a list such that the top entry corresponds to the path ending at the topmost node and the second entry to the path ending at the second node and so on as shown in block 202. If the largest entry is one of the top half entries in the list, then "1" is decided and released as $x_0$ as shown in block 204 and the bottom half of the list is discarded as shown in block 206. In this way, all the paths are discarded whose initial symbols are inconsistent with the released symbol. In the case where the input sequence is minimum-run-length-constrained, the look-ahead paths that violate the constraint can easily be identified and the metrics corresponding to these code-violating paths are prevented from competing in the "max-contest".

At the next clock cycle, a new sample, $r_{1+\tau}$, is received. Now the metrics for the $2^{\tau+1}$ newly extended branches.

$$\lambda_{1+\tau}^{(i)} = -(c_{1+\tau} - y_{1+\tau}^{(i)})^2, 1 \leq i \leq 2^{\tau+1}. \tag{1}$$

where $Y_{1+\tau}$ are output signals associated with new branches, are computed and added to appropriate parent metrics to form $2^{\tau+1}$ updated path metrics, $$m_{1+\tau}^{(i)} = m_\tau^{(j)} + \lambda_{1+\tau}^{(i)}, 1 \leq j \leq 2^\tau, 1 \leq i \leq 2^{\tau+1}, \tag{2}$$

The detector performs the same operation as in the previous clock interval and makes a decision on $x_1$. The process continues in the same manner. The look-ahead tree structure maintained by the detector remains identical from one symbol interval to the next. An output signal, $y_{n+\tau}$, corresponding to a newly extended branch can be obtained from 1 preceding input symbols, $x_{n+\tau}$, $x_{n+\tau-1+1}$, lying on the appropriate look-ahead path (assuming $\tau \geq 1-1$):

$$y_{n+\tau} = \sum_{i=0}^{l-1} fP(i) x_{n+\tau-i} \ (fP(i) = 0 \text{ for all } i < 0 \text{ and } i > l-1) \tag{3}$$

where fP(i) is the channel impulse response. Notice that $y_{n+\tau}$'s are predetermined regardless of the status of the current root node and therefore can be precomputed and incorporated into the hardware. The flow chart shown in FIG. 2 summarizes the FDTS algorithm. The start-up procedure of exhaustively computing $2\tau$ initial path metrics as shown in block 208 can be eliminated if some preliminary decisions (made by a simple auxiliary detector) are used for first $\tau$ symbols to guide the detector along the initial $\tau$ paths. Notice that no random access memory (RAM) is necessary with FDTS since path histories need not be stored and rearranged in each symbol interval as in the VA. Only latched buffers are needed to store the accumulated path metrics. Also, being a fixed-delay system, the FDTS is perfectly synchronous. The processing pattern does not depend on the data sample other than the switching operation which chooses either the top or bottom half of the list of the accumulated path metrics.

Assuming past 1-1 decisions are correct, the probability of making an erroneous decision $x_n$ is upper-bounded (as well as closely approximated) by $$\underset{y,y'}{\text{MIN Prob}} \left\{ \sum_{i=0}^{\tau} (c_{n+i} - y_{n+i})^2 < \sum_{i=0}^{\tau} (c_{n+i} - y'_{n+i})^2 \right\} \tag{4}$$

where $c_{n+i} = y_{n+i} + n'_{n+i}$ and y and y' are noiseless channel output sequences corresponding to a pair of look-ahead paths diverging at the root (and not violating the code-constraint).

The above minimum probability can be expressed in terms of the Q(·) function and the square of its argument can be taken as the effective signal to noise ratio (SNR), which can be shown to be $$\underset{e_x}{\text{MIN}} \frac{\left(\sum_{i=0}^{\tau} e_y^2(i)\right)^2}{4\sigma^2 \sum_{i=0}^{\tau} \sum_{j=0}^{\tau} e_y(i) p_{i-j} e_y(j)} \tag{5}$$

where $$e_y(i) = \sum_{m=0}^{l-1} fP(m) e_x(i-m), \tag{6}$$

$e_x(0) \neq 0, e_x(k) = 0$ for all $k < 0$ and $k > \tau$ and p-(k) is given by $$p_k = \frac{1}{\sigma^2} \int_{-0.5}^{0.5} S_{n'}(D) |_{D=e^{-j2\pi\Omega}} e^{j2\pi k\Omega} d\Omega \tag{7}$$

$$= \frac{1}{\sigma^2} \frac{N_0}{2} \int_{-0.5}^{0.5} \frac{F(D)F(D^{-1})}{R(D)} |_{D=e^{-j2\pi\Omega}} e^{j2\pi k\Omega} d\Omega.$$

Notice that if $e_x = \pm[2]$ is the error sequence responsible for the effective SNRs in Eq. (5) (this makes $e_y(i) = \pm 2fP(i)$), then Eq. (5) becomes identical for $\tau = 1-1$. This implies that when the minimum distance error events is of a single-bit error as is usually the case with minimum-run-length constraints, the FDTS with $\tau = 1-1$ attains the same effective SNR as the VA operating on the combined trellis incorporating both the code constraint and the ISI mechanism. This has been demonstrated for PR systems of the form $(1-D)(1+D)^n$ and $(1+D)^n$ in [17]. Unlike the VA whose search efforts increase in the presence of code-constraints, the FDTS algorithm can easily sort out the code-violating sequences in its look-ahead process without expanding the search space. A practical consequence of this is that a sequence detection that attains the optimum minimum-distance for a given equalized channel can be performed independently of the RLL-decoding, greatly reducing the overall system complexity.

In the above, it was assumed that $\tau$ is always greater than or equal to $1-1$. The following involves the case where $1-1$ is greater than $\tau$. Eq. (3) can be rewritten as $$y_{n+\tau} \sum_{i=0}^{\tau} fP(i) x_{n+\tau-i} + \sum_{i=\tau+1}^{l-1} fP(i) x_{n+\tau=i} \tag{8}$$

where the first summation in the right-hand-side can be constructed from input symbols lying on the look-ahead paths and the second summation can be estimated by using past decisions (i.e., replacing $x_k$ for $k<0$ with $x_k$). A branch metric is calculated according to $$\lambda_{n+\tau} = -[c_{n+\tau} - y_{n+\tau}]^2 \tag{9}$$

$$= -\left[\left(c_{n+\tau} - \sum_{i=\tau+1}^{l-1} fP(i) x_{n+\tau-i}\right) - \sum_{i=0}^{\tau} fP(i) x_{n+\tau-i}\right]^2.$$

Figure 4:
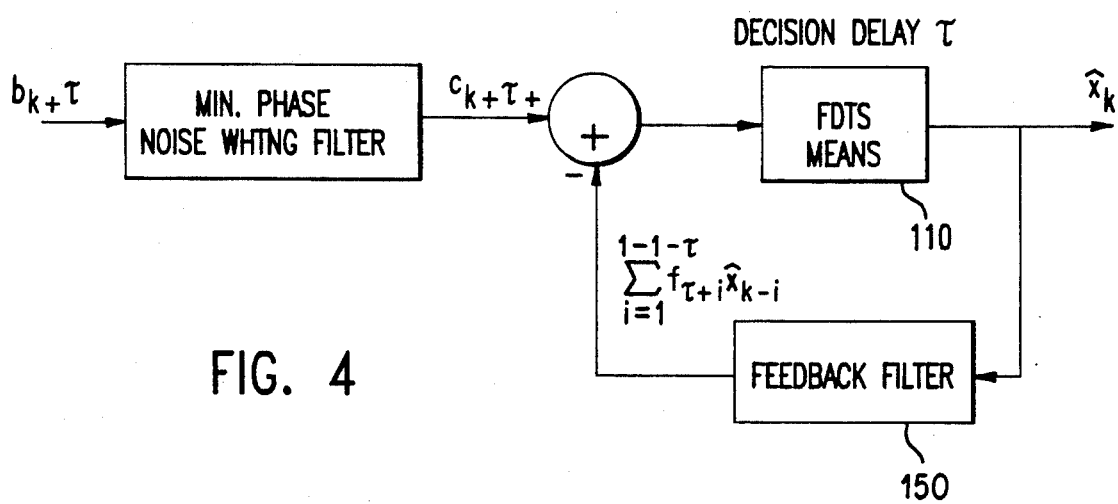
FIG. 4 is a schematic representation of the apparatus for identifying a signal subject to intersymbol interference with decision feedback.

Decision feedback (DF) structure is found in Eq. (8); past decisions weighted by the tail part of the channel impulse response are fed back and subtracted from the observation sample before the latter is fed to the FDTS, as depicted in FIG. 4. Assuming past $1-1-\tau$ decisions are correct, the channel impulse response seen by the FDTS is simply the truncated version of the impulse response seen at the forward filter output consisting only of the initial $\tau+1$ samples. For FDTS/DF, the same minimum-phase noise-whitening filter used for the maximum likelihood sequence detector (MLSD) can be employed. With the whitening filter as the forward filter, there is neither noise enhancement nor noise colorization. Also, the resulting signal energy tends to concentrate in the initial portion of the channel response. This is desirable for FDTS/DF because the more the signal energy in the first few samples of the channel impulse response is, the larger the effective minimum distance achieved by FDTS will be.

Ignoring error propagation, the effective minimum distance can be obtained. It is the smallest Euclidean distance between any two look-ahead paths that satisfy the code constraint and that diverge at the root:

$$\beta_{min}^2 = \underset{e_x}{MIN} \sum_{m=0}^{\tau} [(e_x * fP)_m]^2, \quad (10)$$
$$e_x(0) \neq 0, e_x(k) = 0 \text{ for all } k < 0 \text{ and } k > \tau$$
$$= \underset{e_x}{MIN} \sum_{m=0}^{\tau} \left[ \sum_{i=0}^{\min\{l-1,m\}} fP(i)e_x(m-i) \right]^2.$$

The effective SNR for FDTS/DF can be expressed as $$\frac{\beta_{min}^2}{4(N_o/2)}.$$

When the minimum distance error event is short (e.g., single-error event, double-error event), the lower bound approaches the upper bond and $d_{min}$ closely even for a small $K_o$. Thus, it is expected that with minimum-run-length constraints FDTS/DF will yield a performance that closely approaches the optimum bound. This can be seen in FIG. 6.

For instance, the VA with respect to a linearly equalized channel of impulse length 6 will yield a performance comparable to FDTS/DF with $\tau=1$ (assuming a 5 state finite state machine is necessary to describe (d,k) RLL Code). This is described in Table 1.

TABLE I

| | VA w/LE (l = 6) | FDTS/DF w/$\tau$ = 1 |
|---|---|---|
| # of branches to be extended in each processing cycle | $2 \times 5 \times 2^{6-1} = 320$ | 4 |
| | # of states in VA trellis | |
| Memory Requirement | two-dimensional Random Access Memory (RAM) of size approximately (18 × 32) | one-dimensional simple latched buffer of size 2 |

Figure 6:
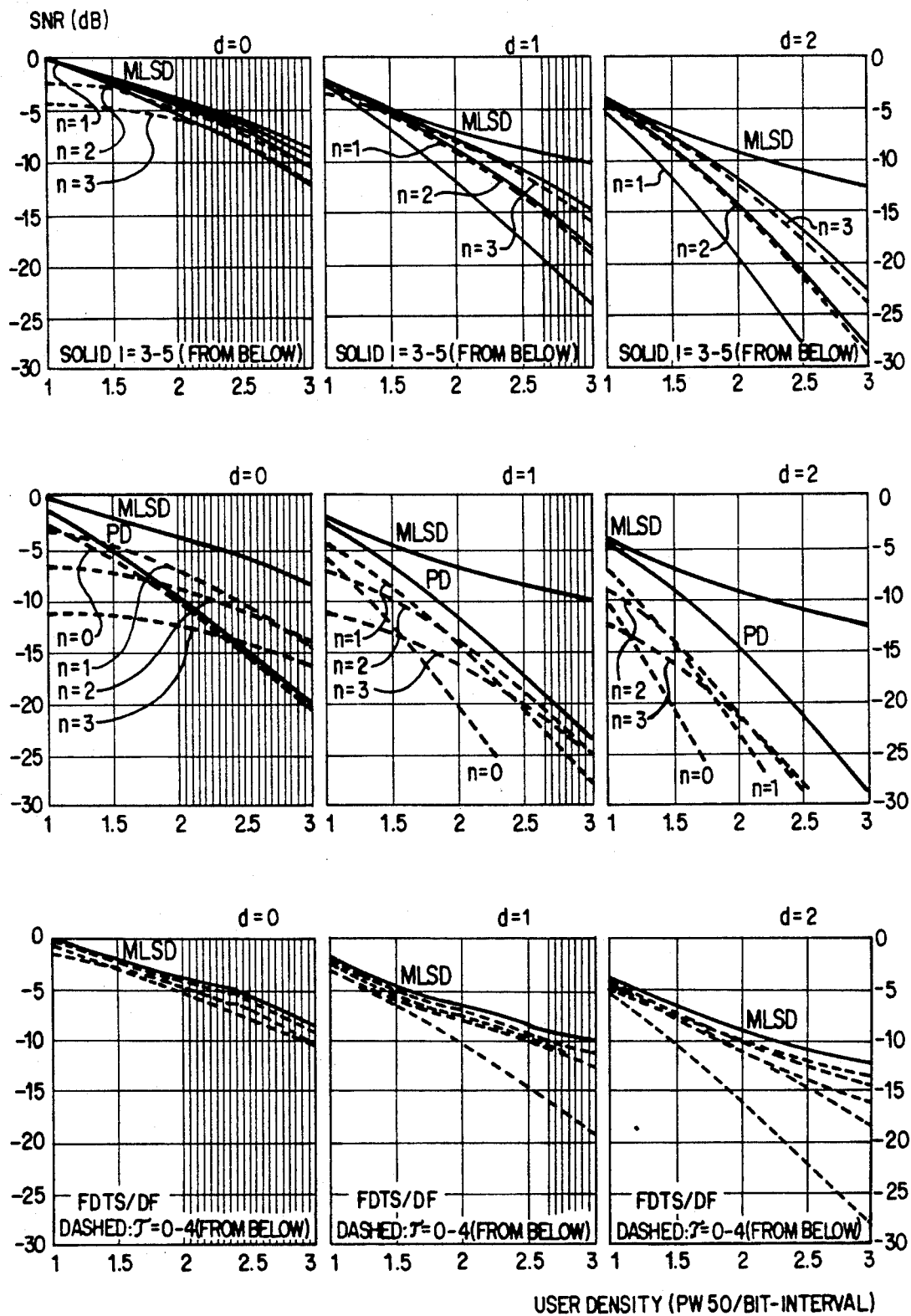
FIG. 6 is a signal to noise ratio vs. density graphic representation with respect to a Viterbi detector, a peak detector and a fixed delay tree search with decision feedback.

A comparison of different detectors is shown in FIG. 6. FIG. 6 is SNR vs. density. The top three graphs concern the optimum-distance sequence detection with linear equalization. The dashed lines are the SNRs for using $(1-D)(1+D)^n$ type equalization whereas the three lower solid lines (corresponding to impulse response length $l=3-5$ from below) are the SNRs associated with the minimum-noise-power linear equalizer (i.e., generalized PR equalization). Note that n=1 and l=3 plots overlap. The topmost solid lines in all graphs are the SNRs corresponding to the full (uncompromised) MLSD. The tree graphs in the middle concern symbol-by-symbol schemes. The dashed lines represents $(1-D)(1+D)^n$ type equalization followed by threshold detection. The lower solid line is the peak detector SNR. The bottom three graphs represent FDTS/DF performance. For each RLL constraint considered, $\tau$ is increased from 0 to 4. FDTS/DF with $\tau=0$ reduces to DFE. The shaded regions represent densities violating the assumed minimum transition spacing requirement (>PW50/2).

In order to apply the FDTS algorithm to a broader class of channel (e.g., systems without run-length-limited coding) and still achieve near-optimum performance, the decision delay has to be large. In this case, the complexity of the FDTS/DF algorithm lies mainly in finding the maximum value among $2^{\tau+1}$ updated path metrics. The maximum-finding operation is slow and expensive when the number of inputs is large.

In the following, we show that by modifying the decision rule of the above detector, the need for the max-finder is completely eliminated with no performance loss. First, observe that we need only to identify which half (top or bottom) of the list includes the maximum, not the maximum entry itself (i.e., we only have to identify the initial symbol lying in the best path, not every symbol in the best path). Imagine passing the path metrics through a bank of identical parallel processors. Assume that each processor is an exponential-like function which weights larger input more heavily. Then, at the output the maximum will be dominantly larger than any other or even larger than the sum of all the rest. When the consecutive outputs belonging to the same half (sharing the same initial input symbol) are summed, the half corresponding to the larger sum will most certainly contain the largest individual metric. In fact, this can be guaranteed if the metrics are amplified before being passed through the exponential functions. In this way, the max-finding operation is reduced to finding the larger of the 2 quantities that correspond to the 2 block-wise sums. The implementation of the exponential function is extremely simple if bipolar transistor characteristic can be used.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

What is claimed is:

1. A method for identifying signals subject to inter-symbol interference comprising the step of:

receiving $\tau+1$ samples of the signals where $\tau \geq 1$; and computer implemented steps of:

forming a tree representation of known responses such that a symbol of each metric of the tree is predetermined by the symbol's position in the tree representation of known responses and the symbol associated with each metric is identified from the sumbol's position, in the tree representation of known responses without the symbol having to be stored in memory, said symbol is representative of a predetermined value and is a digital signal;

searching the tree representation of known responses to determine a path of a branch of the tree which most closely corresponds to the $\tau+1$ samples of the signals; and releasing the symbol of a first metric of a determined branch, said symbol being an identity of a first sample.

2. A method as described in claim 1 wherein the receiving step includes the step of receiving $\tau+1$ sequential samples, with each sample corresponding to a unique portion of the signals.

3. A method as described in claim 2 wherein the searching step includes the step of comparing each symbol of each metric of each pair of each branch with each symbol's corresponding sample in regard to time.

4. A method as described in claim 3 including before the searching step the step of forming the tree representation without paths that violate any run-length limited constraints.

5. A method as described in claim 4 including after the releasing step the step of repeating with each next in time sample the searching and releasing steps until there is no sample left to release.

6. A method as described in claim 5 including after a releasing step the steps of discarding an unused branch without having to store and examine the symbol associated with an initial metric of each path of each branch, and extending each path of an surviving branch by one metric.

7. A method as described in claim 6 including before the repeating step, the step of adjusting the signals by an amount corresponding to a difference between a value of the symbol of a released metric and an actual value of the sample associated with the released metric such that the value of the next in time sample more closely approximates the value of the symbol which identified the next in time sample then the value of the sample associated with the released metric.

8. An apparatus for identifying a signal subject to intersymbol interference comprising:
means for implementing a fixed delay tree search on samples of the signal to determine a symbol associated with a given sample and then releasing that symbol;
means for inputting samples to the implementing means; and
a feedback filter which receives the symbol released from the implementing means and produces a correction factor corresponding to a difference between a value of the released symbol and an actual value of a sample associated with the released symbol such that a value of a next in time sample more closely approximates a value of the symbol which identifies the next in time sample then the value of the sample associated with the released metric.

9. An apparatus as described in claim 8 wherein the implementing means includes a computer having a fixed delay tree search program.

10. An apparatus as described in claim 9 wherein the program comprises the steps of:
forming a tree representation of known responses such that a symbol of each metric of the tree is predetermined by the symbol's position in the tree representation of known responses and the symbol associated with each metric is identified from the symbol's position in the tree representation of known responses without the symbol having to be stored in memory, said symbol is representative of a predetermined value and is a digital signal;
searching the tree representation of known responses to determine a path of a branch of the tree which most closely corresponds to $\tau+1$ samples of the signals where $\tau \geq 1$; and
releasing the symbol of a first metric of a determined branch, said symbol being an identity of a first sample wherein the receiving step includes the step of receiving $\tau+1$ sequential samples, with each sample corresponding to a unique portion of the signals.

11. A method as described in claim 10 wherein the searching step includes the step of comparing each symbol of each metric of each path of each branch with each symbol's corresponding sample in regard to time.

12. A method as described in claim 11 including before the searching step the step of forming the tree representation without paths that violate any run-length limited constraints.

13. A method as described in claim 12 including after the releasing step the step of repeating with each next in time sample the searching and releasing steps until there is no sample left to release.

14. A method as described in claim 13 including after the releasing step the steps of discarding an unused branch without having to store and examine the symbol associated with an initial metric of each path of each branch, and extending each path of the surviving branch by one metric.

15. A method as described in claim 14 including before the repeating step, the step of adjusting the signals by an amount corresponding to a difference between a value of the symbol of a released metric and an actual value of the sample associated with the released metric such that the value of the next in time sample more closely approximates the value of the symbol which identifies the next in time sample then the value of the sample associated with the released metric.

* * * * *